United States Patent [19]

Shih

[11] Patent Number: 5,057,794

[45] Date of Patent: Oct. 15, 1991

[54] PHASE-LOCKED LOOP WITH PATTERN CONTROLLED BANDWIDTH CIRCUIT

[75] Inventor: Cheng C. Shih, Rancho Cordova, Calif.

[73] Assignee: Level One Communications, Inc., Folsom, Calif.

[21] Appl. No.: 661,496

[22] Filed: Feb. 26, 1991

[51] Int. Cl.⁵ .......................................... H03L 7/089
[52] U.S. Cl. .................................... 331/1 A; 331/17; 375/120
[58] Field of Search ................ 331/1 A, 17, 18, 25; 375/120

[56] References Cited

U.S. PATENT DOCUMENTS

| | | | |
|---|---|---|---|
| 4,242,639 | 12/1980 | Boone | 328/155 |
| 4,584,695 | 4/1986 | Wong et al. | 375/81 |
| 4,712,223 | 12/1987 | Nelson | 377/43 |
| 4,712,224 | 12/1987 | Nelson | 377/43 |
| 4,733,197 | 3/1988 | Chow | 331/1 A |
| 4,791,386 | 12/1988 | Shiga | 331/1 A |
| 4,855,683 | 8/1989 | Troudet et al. | 328/155 |

*Primary Examiner*—David Mis
*Attorney, Agent, or Firm*—Merchant, Gould, Smith, Edell, Welter & Schmidt

[57] ABSTRACT

An all-digital phase-locked loop (ADPLL) is disclosed having a wide bandwidth while maintaining relatively small steps for phase error correction. A random walk filter with memory and a pattern sensitive phase adjustment circuit cooperate to control the ADPLL frequency/phase adjustment rate by taking multiple, relatively small steps in phase error correction at fixed intervals of time. A short cycle occurs when the phase disparity is large, interrupting the execution of the fixed interval cycle expediting the ADPLL phase lock time without sacrificing resolution in the phase error correction steps.

5 Claims, 5 Drawing Sheets

PHASE-LOCKED LOOP WITH PATTERN CONTROLLED BANDWIDTH CIRCUIT

FIELD OF THE INVENTION

This invention relates generally to a phase-locked loop and more particularly, to an all-digital phase-locked loop (ADPLL) having a wide bandwidth while maintaining relatively small steps in phase error correction.

DESCRIPTION OF RELATED ART

In general terms, a phase-locked loop (PLL) is a closed-loop circuit either analog or digital in nature, wherein an output signal is produced having a frequency which is proportional to a frequency of an applied reference input signal. An all-digital phase-locked loop (ADPLL) is a PLL in which not only is the output and reference input signal digital in nature, but all intermediate signals in the circuit are digital as well. An exemplary, but not exclusive use for an ADPLL is in the recovery of a clock signal from a stream of data, such as in a digital telephony system. A typical ADPLL comprises a phase detector, a loop filter and a digitally controlled oscillator (DCO). The phase detector detects frequency/phase differences between the applied reference input signal and the DCO output and generates an error signal in response thereto. The error signal is applied to the DCO to adjust for the difference in frequency/phase. Phase detectors are well known in the art as indicated in a variety of reference works including *Phase-Locked Loops* by Dr. Rolland E. Best, (McGraw-Hill, 1984). A wide variety of phase detectors are compatible with the present invention, including but not limited to, a simple exclusive OR (XOR) gate.

DCOs are well known in the art and can take on many forms as well. A typical DCO is realized by applying a clock signal having a fixed and stable frequency to an adjustable divide-by-N divider and taking the output from the divider. The DCO frequency is adjusted varying the value of divisor N in response to the frequency/phase error detected by the phase detector so as to increase or decrease the frequency of the signal from the divider.

A digital loop filter, such as a conventional random walk filter having low pass frequency characteristics, is placed between the output of the phase detector and the DCO to wash out transient phase errors detected by the phase detector so as not to cause adjustment to the frequency of the DCO output signal. A conventional random walk filter typical comprises a N-bit counter which counts up and down from a center count of N/2 generating a pulse indicating a carry when counting past the upper count limit (N) or a borrow when counting past the lower count limit (0). Upon counting past the upper or lower count limit, the N-bit counter generates the pulse and presets back to a center count of N/2 and continues to count up or down.

Figure 1:
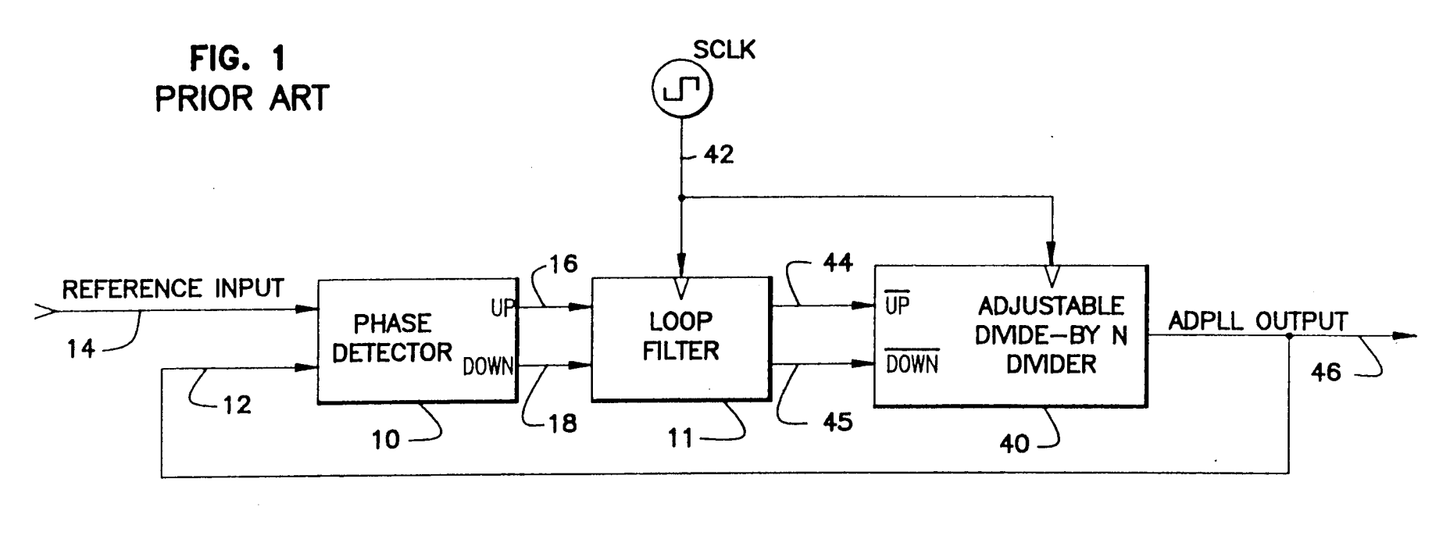
FIG. 1 is a prior art block diagram of an all-digital phase-locked loop (ADPLL)

Illustrated in FIG. 1 is a prior art all-digital phase lock loop (ADPLL) constructed with a phase detector 10, a loop filter 11 and a divide-by-N divider 40 having an adjustable divisor N. A clock signal (SCLK) having a fixed and stable frequency is applied on clock input line 42 to loop filter 11 and divider 40. The output of divider 40 is the overall ADPLL output 46. The ADPLL output 46 is also feedback to a first input 12 of phase detector 10. A reference input signal is applied to a second input 14 of phase detector 10. Loop filter 11 has low frequency pass properties requiring a steady input from either output line 16 or 18 of phase detector 10 before outputs 44 and 45 change. Outputs 44 and 45 of loop filter 11 are fed into divider 40 and control the value of divisor N. When the frequency of the ADPLL output 46 signal is greater than the applied reference input on second input 12, phase detector 10 forces divider 40 to increment divisor N through loop filter 11 by asserting count up pin 16. Likewise, phase detector 10 forces divider 40 to decrement divisor N through loop filter 11 by asserting count down pin 18 when the frequency of the ADPLL output 46 signal is less than the applied reference input on second input 14.

Although this simple ADPLL is useful for many applications, it suffers a number of defects when used for clock recovery from a stream of data. The loop filter exhibits a lethargic response when stimulated with rapidly varying inputs causing the overall ADPLL bandwidth to be narrow.

Clock recovery in a digital telephony system is typically achieved by applying a stream of data as the ADPLL reference input on second input 14. The ADPLL attempts to synthesize the characteristic frequency of the applied input and lock on to it during lulls in transmission. Communication protocol standards such as those set forth for the Integrated Services Digital Network (ISDN), more fully described in the American National Standards Institute specification ANSI T1.601-1988, and more specifically, the operation of the echo canceller in an ISDN, require that the ADPLL exhibit both a wide bandwidth and have relatively small steps in phase error correction in order for it to properly operate. Conventional ADPLL such as the one set forth in FIG. 1, cannot meet these somewhat contradictory demands.

SUMMARY OF THE INVENTION

An all-digital phase-locked loop (ADPLL) is disclosed having a wide bandwidth while maintaining relatively small steps for phase error correction. The combination of these seemingly mutually exclusive attributes is accomplished by introducing a random walk filter with memory (RWFM) and a pattern sensitive phase adjuster (PSPA) circuit between the phase detector and the digitally controlled oscillator (DCO) of a conventional ADPLL. The RWFM and PSPA circuit cooperate to control the frequency/phase adjustment rate of the ADPLL by taking multiple, relatively small steps in phase error correction at fixed intervals of time. A short cycle occurs when the frequency/phase disparity is large. The short cycle expedites the ADPLL phase lock time without sacrificing resolution in phase error correction steps by interrupting the execution of the fixed interval cycle. A random walk filter with memory (RWFM) having a N-bit up/down counter presets to a count closer to N, such as, but not limited to, a count of 3N/4 upon overflowing, and upon underflowing, to a count closer to zero such as, but not limited to, a count of N/4. By presetting to a value closer to the overflow/underflow limit, the RWFM overflows or underflows faster than a conventional random walk filter. The biasing of the N-bit counter in the RWFM towards an overflow/underflow condition eliminates unnecessary counts by the N-counter as the ADPLL approaches phase lock resulting in the ADPLL converging more rapidly on the reference input while maintaining relatively small steps in phase error correction. The bias values are selected such that when ADPLL reaches phase lock, random variations detected by the phase detector advance and retard the N-bit counter in the RWFM without ever reaching an overflow or underflow condition. Only a consistent frequency/phase disparity between the DCO and the reference input forces the RWFM to overflow or underflow, generating a control signal for the pattern sensitive phase adjuster circuit.

The pattern sensitive phase adjuster (PSPA) circuit comprises a first and a second counter. The first counter controls a time interval between corrective steps taken in the DCO output frequency while the second counter controls the number of corrective steps taken in the DCO frequency. The circuit is regarded as "pattern sensitive" because the DCO frequency/phase adjustment rate established by the first and second counters is sensitive and subordinate to the data pattern on the reference input.

For a better understanding of the invention, as well as other objects and further features thereof, reference is had to the following detailed description of the preferred embodiment taken in conjunction with accompanying drawings.

BRIEF DESCRIPTION OF THE DRAWINGS

Referring now to the drawings in which like reference numbers represent corresponding parts throughout.

DETAILED DESCRIPTION OF THE PREFERRED EMBODIMENT

Before describing in detail, the particular all-digital phase-locked loop (ADPLL) according to the present invention, it should be noted that the invention resides primarily in a novel structural combination of conventional digital circuits, and not in the particular detailed configuration thereof. Accordingly, the structure, control and arrangement of these conventional circuits have been illustrated in the drawings by readily understandable block representations and schematic diagrams, which show only those specific details that are pertinent to the present invention, in order not to obscure the disclosure with structural details which will be readily apparent to those skilled in the art having the benefit of the description herein. Thus, the block diagram illustrations in the figures do not necessarily represent the mechanical structural arrangement of the exemplary system, but are primarily intended to illustrate the major structural components in a convenient functional grouping, whereby the present invention may be more readily understood.

Figure 2:
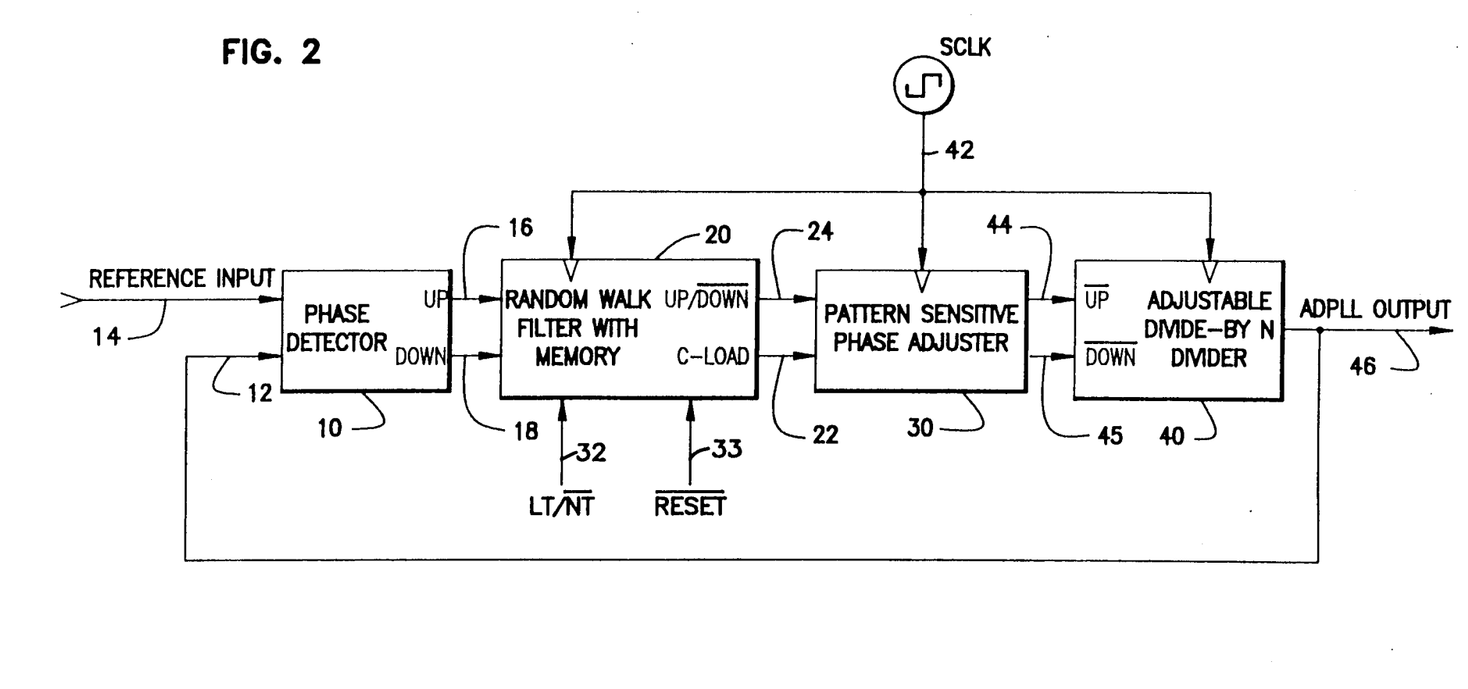
FIG. 2 is a block diagram of an ADPLL constructed in accordance with the principles of the present invention.

Reference is now directed to FIG. 2, wherein the present invention is illustrated in block diagram form comprising a random walk filter with memory (RWFM) 20 and a pattern sensitive phase adjuster (PSPA) circuit 30 coupled in cascade between phase detector 10 and divide-by-N divider 40. Count up line 16 and count down line 18 of phase detector 10 are coupled to the input of RWFM 20. RWFM 20 generates an output (c-load) pulse on output line 22 and an up/down logic signal on line 24 in response to a steady assertion of count up line 16 or count down line 18 by phase detector 10. The rate at which c-load pulses occur on line 22 is proportional to the frequency/phase disparity between the reference input on line 14 and ADPLL output on line 12. Lines 22 and 24 from RWFM 20 are coupled to the input of pattern sensitive phase adjuster (PSPA) circuit 30. PSPA circuit 30 utilizes the signals on lines 22 and 24 to increment and decrement divisor N of divider 40 in relatively small, discrete steps. System clock (SCLK) on clock line 42 synchronizes operation between RWFM 20, PSPA circuit 30 and divider 40.

Figure 3:
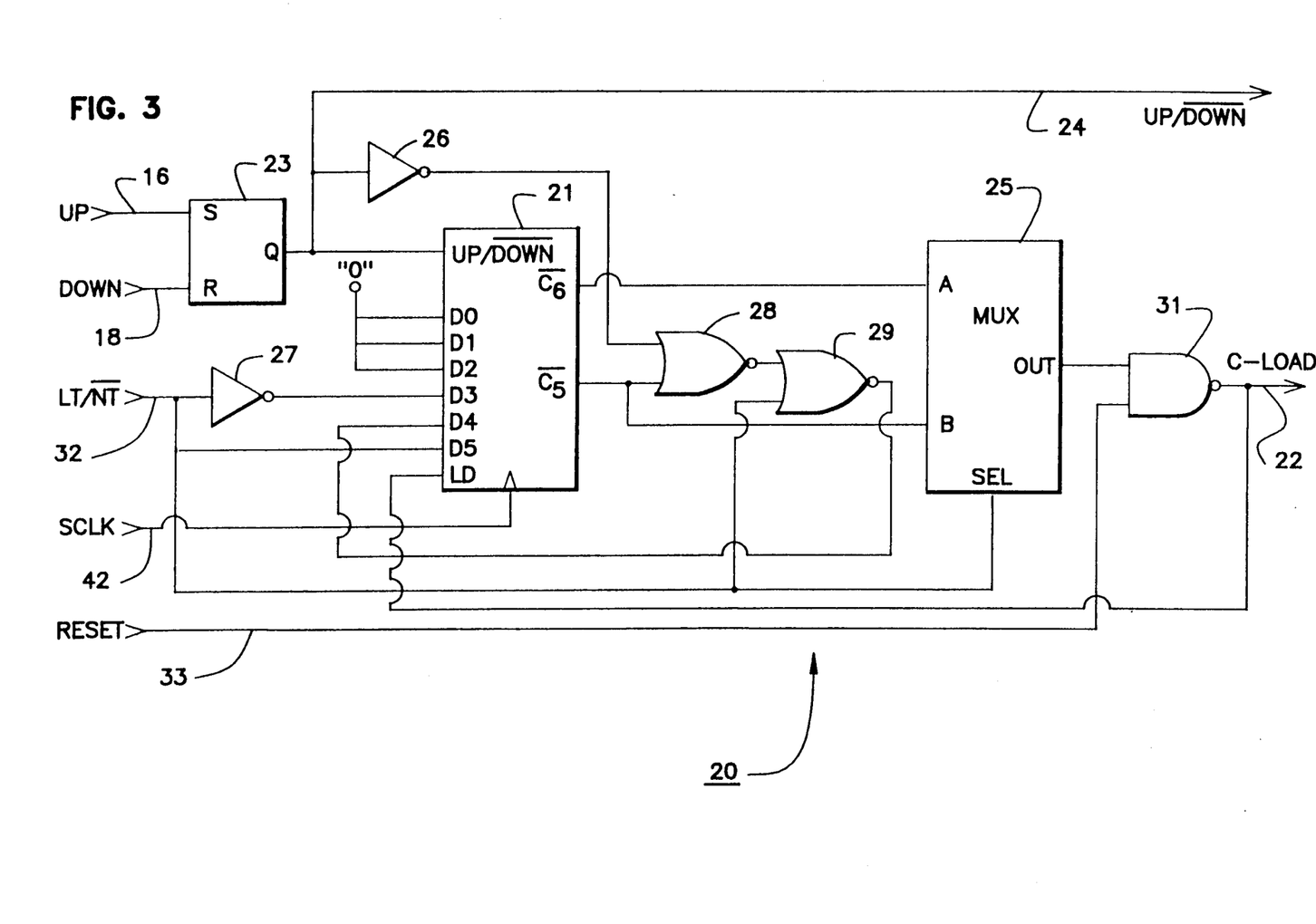
FIG. 3 is a schematic diagram of a random walk filter with memory (RWFM) as depicted in FIG. 2.

Referring now to FIG. 3, a schematic drawing of a random walk filter with memory (RWFM) 20 is illustrated. RWFM 20 comprises a presettable N-bit up/down counter 21, a S-R flip-flop 23, a two channel multiplexer 25, inverters 26 and 27, NOR gates 28 and 29 and NAND gate 31. Presettable up/down counters are well known in the art, such as for example a TTL 74LS168 which is a synchronous, presettable up/down counter having a four bit length (0-15 count). In the preferred embodiment, up/down counter 21 has a selectable five or six bit length, selectable by asserting a logic "0" or "1" on LT/NT line 32. Those skilled in the art will readily recognize that the bit length of counter 21 is easily expandable or contractible with the addition or deletion of cascade stages. Up/down output 24 of S-R flip-flop 23 is set to a logic "1" and reset to a logic "0" by count up line 16 and count down line 18, respectively. Output 24 is connected to the up/down input of counter 21. A logic "1" asserted on the up/down input forces the counter 21 to increment on a rising edge of the applied clock (SCLK) on clock line 42. In an similar fashion, a logic "0" asserted on the up/down input forces the counter 21 to decrement on a rising edge of the applied clock (SCLK) on clock line 42. Asserting LT/NT line 32 to a logic "1" forces counter 21 to function as a conventional random walk filter having a 6-bit length (0-63 count) presetting on an underflow or an overflow count to a midpoint count of 31. Asserting LT/NT line 32 to a logic "0" forces counter 21 to have a 5-bit length (0-31 count) presetting to a value of 24 on an overflow condition, biasing it towards another overflow. Likewise on an underflow condition, counter 21 presets to a value of 8, biasing it towards another underflow. Asserting LT/NT line 32 to a logic "1" also forces multiplexer 25 to route carry bit (/C6) from a 6-bit (0-64 count) to a first input of NAND gate 31. When LT/NT line 32 is asserted to a logic "0", multiplexer 25 routes carry bit (/C5) from a 5-bit (0-31 count) to the first input of NAND gate 31. The output of NAND gate 31 generates a c-load pulse on line 22 which is routed to the load (preset) input on counter 21 and to the PSPA circuit 30. A c-load pulse forces counter 21 to preset to a value present on data lines D0 through D5. A second input to NAND gate 31 is connected a system /RESET line 33 forcing a c-load pulse on line 22 when /RESET line 33 is asserted to a logic "0". Up/down output 24 from S-R flip-flop 23 is coupled through inverter 26 to a first input of NOR gate 28. A second input to NOR gate 28 is connected to the carry bit /C5 of counter 21. The output of NOR gate 28 indicates an overflow condition in a 0–31 count by generating a logic "0" when line 24 is a logic "1" indicating a up count and /C5 is a logic "0". The output of NOR gate 28 is connected to a first input of NOR gate 29. A second input of NOR gate 29 is connected to LT/NT line 32. The output of NOR gate 29 is connected to preset data line D4 of counter 21. When LT/NT line 32 is asserted to a logic "1" indicating conventional random walk filter operation, D4 is forced to a logic "0". When (LT/NT) 32 is asserted to a logic "0" indicating random walk filter with memory (RWFM) operation, preset data line D4 of counter 21 is forced to a logic "1" on an overflow condition. LT/NT line 32 is also connected to preset data line D5 and through inverter 27 to preset data line D3. Preset data bits D0, D1, D2 are connected to a logic "0". An c-load pulse on line 22 caused by an underflow or overflow condition forces counter 21 to preset to value presented by preset data bit bits D0–D5. Presetting counter 21 when LT/NT is asserted to logic "0" forces a preset value of eight on an underflow and a preset value of twenty-four on an overflow. Those skilled in the art will readily recognize that the preset values for underflow and overflow conditions can be easily modified.

Figure 4:
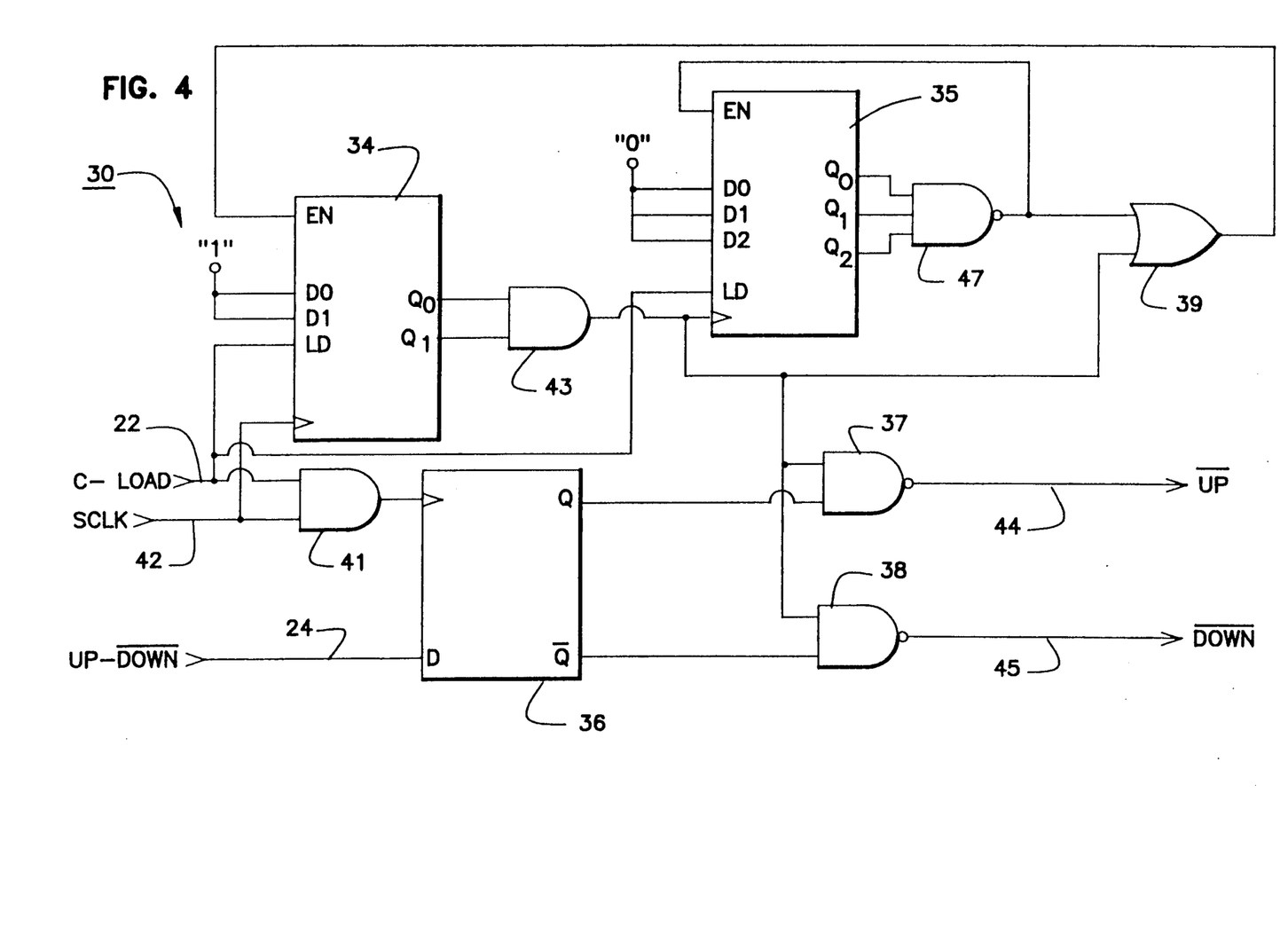
FIG. 4 is a schematic diagram of a pattern sensitive phase adjuster circuit as depicted in FIG. 2.

Reference is now directed to FIG. 4 wherein the pattern sensitive phase adjuster (PSPA) circuit 30 is depicted in schematic form. PSPA circuit 30 comprises a first up counter 34, a second up counter 35, a D-flip-flop 36, NAND gates 37, 38, and 47, OR gate 39 and AND gates 41 and 43. In the preferred embodiment, first up counter 34 has a two bit length (0–3 count) and second up counter 35 has a three bit length (0–7 count). Those skilled in the art will readily recognize that the length of first counter 34 and second counter 35 can be easily extended. Line 22 is connected to a first input to AND gate 41 and to a load (preset) input to first up counter 34 and to a load (preset) input to second up counter 35. System clock (SCLK) on line 42 is connected to a second input to AND gate 41 and to a clock input on first up counter 34. The output of AND gate 41 is connected to a clock input on D-flip-flop 36 providing a clock pulse synchronous to SCLK for D-flip-flop 36 when both SCLK and c-load are present. Up/down logic signal on line 24 is connected to the D-input on D-flip-flop 36. The outputs Q and /Q of D-flip-flop 36 are connected to a first input to NAND gate 37 and a first input to NAND gate 38 respectively. A second input to both NAND gates 37 and 38 is connected to the output of AND gate 43. The outputs of NAND gates 37 and 38 are connected through lines 44 and 45 to the /UP and /DOWN inputs of adjustable divide-by divider 40 respectively. OR gate 39 has a first input connected to the output of AND gate 43 and a second input connected to the output of NAND gate 47. AND gate 43 has a first input connected to the $Q_0$ output and a second input connected to the $Q_1$ output of first up counter 34. NAND gate 47 has a first input connected to $Q_0$, a second input connected to $Q_1$ and a third input connected to $Q_2$ all outputs of second up counter 35. First up counter 34 is enabled by the output of OR gate 39 when either the output of AND gate 43 or the output of NAND gate 47 is a logic "1". Stated in the alternative, first up counter 34 is disabled when the output of second up counter 35 reaches a count of seven ($Q_0=1$, $Q=1$, and $Q_2=1$) and first up counter 34 has an output count other than three ($Q_0=0$ or $Q_1=0$). Second up counter 35 has an enable line connected to the output of NAND gate 47 so that it disables itself when it reaches a count of seven ($Q_0=1$, $Q_1=1$, and $Q_2=1$).

Figure 5:
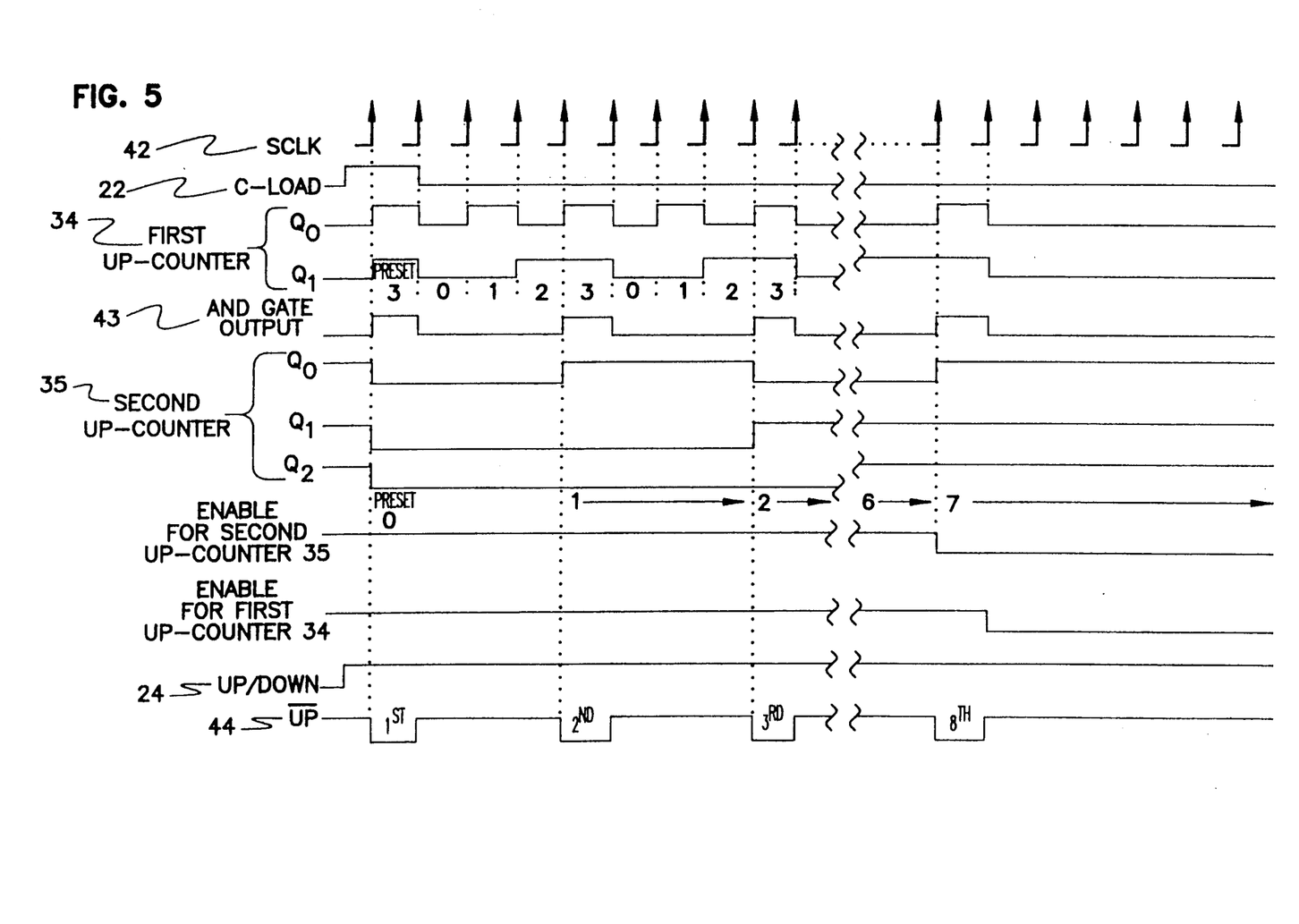
FIG. 5 is a timing diagram illustrating the temporal relationship of signals in the random walk filter with memory and the pattern sensitive phase adjuster circuit.

In the following description, reference is made to FIG. 5, a timing diagram illustrating the temporal relationship of signals in the RWFM 20 and PSPA circuit 30. A count up operation on /UP line 44 will be described assuming UP/DOWN line 24 is asserted to a logic "1". A discussion concerning the down count operation on /DOWN line 45 is identical with the exception that UP/DOWN line 24 is asserted to a logic "0" and the focus is on /DOWN line 45 as opposed to /UP line 44. In the following discussion, synchronous operation with SCLK on line 42 is assumed, that is, input and output signal are registered on the rising edge of SCLK on line 42. When c-load is asserted on line 22, first up counter 34 is preset to three ($Q_0=1$, $Q_1=1$) and second up counter 35 is preset to zero ($Q_0=0$, $Q_1=0$, and $Q_2=0$). Assuming that c-load is not asserted again and second counter has not reached a count of seven, first up counter 34 continues to count up and roll over to zero. Each time first up counter 34 reaches a count of three, an /UP pulse occurs on line 44 forcing second up counter 35 to increment and forcing the divisor of divide-by divider 40 to increment. Once second up counter 35 reaches a count of seven it disables itself through NAND gate 47. The subsequent count of first up counter 34 from three to zero after second up counter 35 reaches a count of seven disables first up counter 34 through OR gate 39. No further pulses on /UP line 44 will be generated unless c-load on line 22 is asserted again.

When c-load is asserted on line 22 before second up counter 35 reaches a count of seven, the count UP/DOWN operation is reset. That is, the cycle of producing eight /UP pulses on line 44, one every fourth SCLK pulse, is shortened. In this manner, asserting a c-load pulse on line 22 will force an immediate /UP pulse on line 44. The continuous assertion of c-load on line 22 will cause continuous /UP pulses on line 44 thus expediting the process of adjusting the divisor N of divide-by-N divider 40 without sacrificing resolution on the phase correction steps.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A phase-locked loop having a pattern controlled bandwidth circuit, a phase detector with an output and a digitally controlled oscillator having an input and an output, the pattern controlled bandwidth circuit comprising:
  a) an up/down counting random walk filter with memory having an input and an output, the input coupled to the phase detector output, the random walk filter with memory, in response to a first overflow count, producing a count up pulse on the output and presetting to a first biased count biased towards a second overflow count, and in response to a first underflow count, the random walk filter with memory producing a count down pulse on the output and presetting to a second biased count biased towards a second underflow count; and b) a pattern sensitive phase adjuster circuit having an input, an output, and first and second counter means coupled therebetween, the input coupled to the output of the random walk filter with memory, the output coupled to the digitally controlled oscillator input, the pattern sensitive phase adjuster circuit providing a series of pulses for controlling the digitally controlled oscillator frequency in response to stimulus from the random walk filter with memory, wherein first counter means provides a time interval value between pulses in the series and second counter means provides a quantity value for a number of pulses within the time interval.

2. A phase-locked loop in accordance with claim 1, wherein the random walk filter with memory comprises a presettable N-bit up/down counter wherein the counter is preset to a value of 3N/4 in response to an overflow count and is preset to a value of N/4 in response to an underflow count.

3. A phase-locked loop in accordance with claim 2, wherein the random walk filter with memory further comprises selection means for selecting the random walk filter with memory to function as a conventional random walk filter having the counter preset on an underflow and an overflow count to a midpoint count of N/2.

4. A phase-locked loop in accordance with claim 1, wherein the pattern sensitive phase adjuster circuit comprises:
1) preset means for presetting first counting means to an initial count and presetting second counting means to a rollover count in response to stimulus from the random walk filter with memory; and
2) disabling means for disabling first and second counting means in response to first counting means reaching a terminal count.

5. A phase-locked loop in accordance with claim 4, wherein the pattern sensitive phase adjuster circuit further comprises means for short cycling first and second counting means in response to a stimulus from the random walk filter with memory.

* * * * *

UNITED STATES PATENT AND TRADEMARK OFFICE
CERTIFICATE OF CORRECTION

PATENT NO. : 5,057,794
DATED : October 15, 1991
INVENTOR(S) : Cheng C. Shih

It is certified that error appears in the above-identified patent and that said Letters Patent is hereby corrected as shown below:

ON THE TITLE PAGE

In the Abstract, line 8, "smnall" should read --small--.
Column 1, line 52, "typical" should read --typically--.
Column 4, line 39, "an" should read --a--.
Column 4, line 63, insert --to-- after the word "connected".
Column 5, line 16, "An" should read --A--.
Column 5, line 18, insert --a-- after the word "to" (2nd occur.).
Column 5, line 19, insert --,-- after the word "bit".
Column 5, line 60, "Q," should read --$Q_2$,--.
Column 5, line 65, "Q" should read --$Q_1$--.
Column 6, line 14, "signal" should read --signals--.

Signed and Sealed this

Eighth Day of June, 1993

Attest:

MICHAEL K. KIRK

Attesting Officer    Acting Commissioner of Patents and Trademarks